United States Patent [19]
Kimura et al.

[11] Patent Number: 5,615,144
[45] Date of Patent: Mar. 25, 1997

[54] NON-VOLATILE FERROELECTRIC MEMORY DEVICE WITH LEAKAGE PREVENTING FUNCTION

[75] Inventors: Tohru Kimura; Hiroki Koike, both of Tokyo, Japan

[73] Assignee: NEC Corporation, Tokyo, Japan

[21] Appl. No.: 511,527

[22] Filed: Aug. 4, 1995

[30] Foreign Application Priority Data

Aug. 12, 1994 [JP] Japan .................................... 6-190448

[51] Int. Cl.$^6$ .................................................. G11C 11/22
[52] U.S. Cl. ..................... 365/145; 365/117; 365/189.09
[58] Field of Search .................................... 365/145, 117, 365/189.09

[56] References Cited

U.S. PATENT DOCUMENTS

| | | | |
|---|---|---|---|
| 4,888,630 | 12/1989 | Paterson | 357/23.5 |
| 5,345,415 | 9/1994 | Nakao et al. | 365/145 |
| 5,414,654 | 5/1995 | Kubota et al. | 365/145 |
| 5,515,312 | 5/1996 | Nakakuma et al. | 365/145 |

FOREIGN PATENT DOCUMENTS

| | | |
|---|---|---|
| 2-110865 | 4/1990 | Japan . |
| 2-110895 | 4/1990 | Japan . |

OTHER PUBLICATIONS

T. Sumi et al., "A 256kb Nonvolatile Ferroelectric Memory at 3V and 100ns", *1994 IEEE International Solid–State Circuits Conference,* Digest of Technical Papers, pp. 268–269.

*Primary Examiner*—Viet Q. Nguyen
*Attorney, Agent, or Firm*—Sughrue, Mion, Zinn, Macpeak & Seas

[57] ABSTRACT

A non-volatile ferroelectric memory device includes a plurality of memory cells provided in a matrix manner, each of which comprises a transistor having a gate and source and drain regions formed in a semiconductor region, and a ferroelectric capacitor having first and second electrodes and a ferroelectric layer interposed between the first and second electrodes. The second electrode is connected to one of the source and drain regions of the transistor. The memory device further includes a plurality of pairs of bit lines, each of the bit lines of each of the pairs being connected to the other of the source and drain regions of the transistor of each memory cell in a column of the plurality of memory cells, a plurality of word lines each of which is connected to the gate of the transistor of each memory cell in a row of the plurality of memory cells, a plate potential section for generating a first predetermined potential intermediate between a reference potential and a high DC voltage and supplying the first potential to the first electrode of each of the plurality of memory cells, a well potential section for generating a second predetermined potential lower than the first potential with respect to the reference potential and supplying the second potential to the semiconductor region of each of the plurality of transistors, and a sense amplifier section for sensing a data using potentials on the bit lines of each of the plurality of pairs of bit lines. The well potential section functions as a preventing section for preventing a leakage current from flowing from the ferroelectric layer.

28 Claims, 11 Drawing Sheets

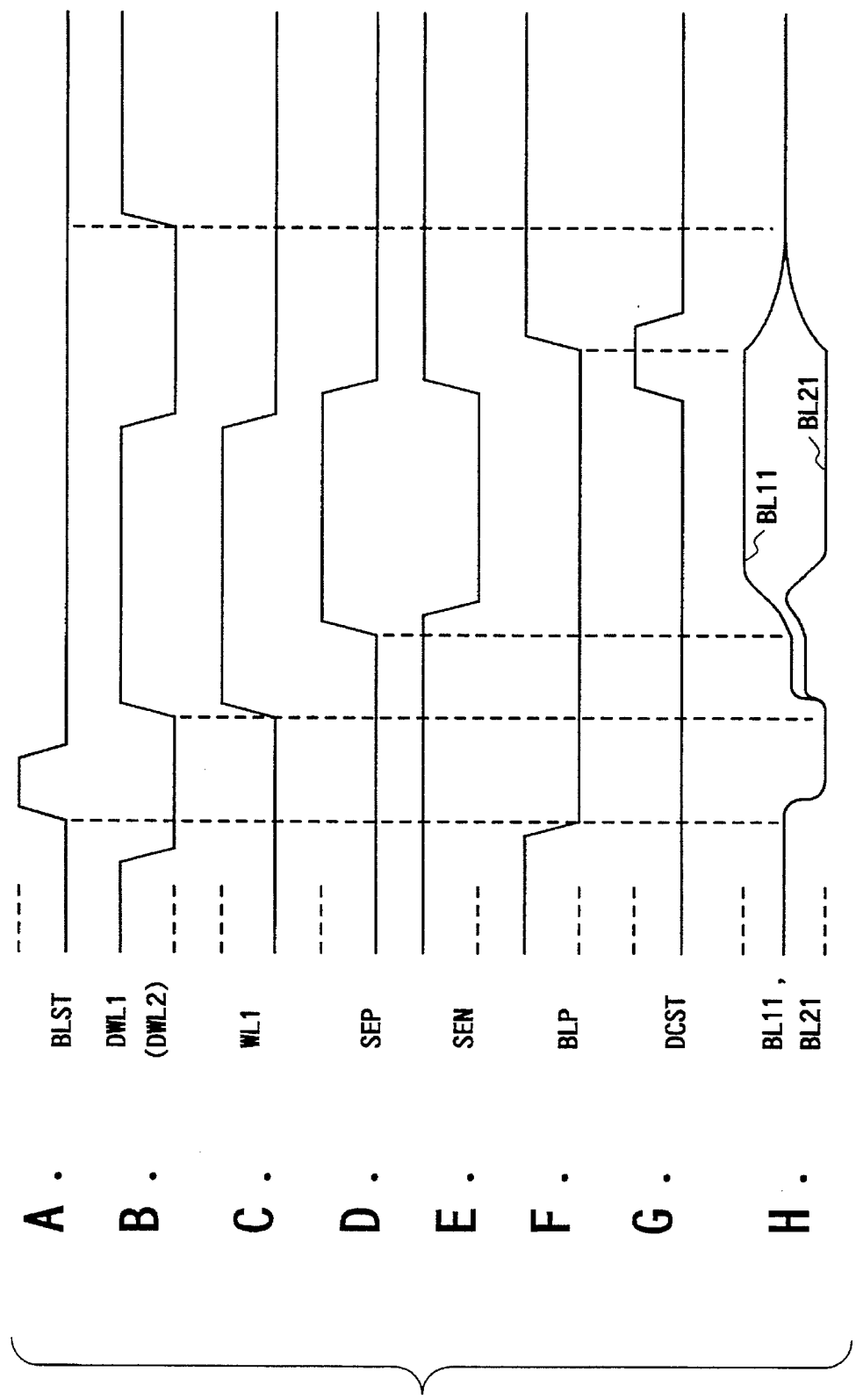

NON-VOLATILE FERROELECTRIC MEMORY DEVICE WITH LEAKAGE PREVENTING FUNCTION

BACKGROUND OF THE INVENTION

1. Field of the Invention

The present invention relates to a non-volatile ferroelectric memory device, and more particularly, a non-volatile ferroelectric memory device having the structure in which a plurality of memory cells of a 1-capacitor and 1-transistor type are arranged, and a function to prevent leakage current from the capacitors.

2. Description of Related Art

First, the general structure and general operation principle of a non-volatile ferroelectric memory device will be described below with reference to FIGS. 1A and 1B.

FIG. 1A is a block diagram of one of a plurality of memory cells of the non-volatile ferroelectric memory device. FIG. 1B is a cross sectional view of such a memory. Referring to these figures, a memory cell MC includes a capacitive element C and a transistor T. The capacitive element C is constructed to sandwich a ferroelectric film FE between two electrodes EL1 and EL2 opposing to each other. The electrode EL1 is connected to a plate line PL and the electrode EL2 is connected to one of the source and drain regions (S/D) of the transistor T. The other of the source and drain regions (S/D) is connected to a bit line BL. The gate of the transistor T is connected to a word line WL.

Next, in the ferroelectric film, spontaneous polarization has been generated and the polarization characteristic curve when an electric field is applied externally to the ferroelectric film FE represents a hysteresis curve, as shown in FIG. 2A. When the external electric field is removed, two stable points exist on the polarization curve due to the hysteresis characteristic, as shown as A and C in FIG. 2A. Therefore, the capacitive element C shown in FIG. 1A can hold a binary data when the ferroelectric film FE can be used as a dielectric film of the capacitive element. Further, the capacitive element C can continue to hold the binary data even after the power is disconnected or the electric field is removed. That is, the capacitive element is non-volatile.

In order to change the polarization state from the state A to the state C, it is required that a positive electric field larger than the coercive electric field Ec of the ferroelectric film FE is applied to the ferroelectric film FE in a positive direction. This is accomplished in the example shown in FIGS. 1A and 1B, by setting the word line WL to a high level so that the transistor T is turned on and further by applying a positive electric field larger than the coercive electric field Ec of the ferroelectric film FE in a positive direction between the bit line BL and the plate line PL. On the contrary, in order to change the polarization state from the state C to the state A, it is required that a negative electric field larger than the coercive electric field Ec in a negative direction is applied to the ferroelectric film FE.

In order to read a data held in the capacitive element C, it is required that the transistor T is turned on and a positive electric field Emax is applied to the ferroelectric film FE between the bit line BL and the plate line PL. In this case, when the capacitive element C is in the state A, charge corresponding to (Pmax+Pr) can be taken out as the data held in the state A, whereas, when the capacitive element C is in the state C, charge corresponding to (Pmax−Pr) can be taken out as the data held in the state C. By sensing the charge taken out from state A or C, the data held in the capacitive element C can be determined. In this case, this read operation is destructive to the data held in the state A. Therefore, it is necessary to apply the negative electric field —Emax to the ferroelectric film FE to rewrite the data to the capacitive element C after data is determined to be the data held in the state A.

As shown in FIG. 2B, when the ferroelectric film FE has the film thickness of d, and a voltage of V is applied between electrodes EL1 and EL2, there is relation V=E×d between the voltage V and an electric field E applied to the capacitive element C. Accordingly, a voltage corresponding to the coercive electric field is Vc=Ec×d. Further, in a case where a non-volatile ferroelectric memory device in which a plurality of memory cells MC are contained therein is typically driven with a single power source, the state D (—Emax) is made to correspond to the lower logic level of a binary data and the state B is made to correspond to the higher logic level of the binary data.

A conventional non-volatile ferroelectric memory device of a single power source driving type has a memory cell array 1x in which a plurality of memory cells MC are arranged, as shown in FIG. 3. In the memory cell array 1x, each of the memory cells MC includes a capacitive element C and a transistor T. The capacitive element C is constituted of a ferroelectric film sandwiched between electrodes opposing to each other. One of the electrodes of the capacitive element C is connected to one of the source and drain regions of the transistor T and the other is connected to a plate line PL1. The other of the source and drain regions of the transistor T is connected to a bit line BL (BL11, . . . , BL2n). The gate of transistor T is connected to a word line WL (WL1, WL2, . . . ). The word lines WL1 and WL2 are also connected to the gates of transistors T41 and T42. One electrode of each transistor T41 or T42 is commonly connected to a plate line PL1 and the other electrode of each transistor is commonly connected to a plate line potential supplying line PL.

Next, the read operation of the above conventional non-volatile ferroelectric memory device will be described below with reference to a waveform diagram of FIG. 4.

The bit line pair BL11 and BL21 and the plate line PL1 are set to the ground potential level in a standby state before the word line WL1 rises to a selection level (high level). When the word line WL1 is set to the selection level, the memory cells MC connected to the word line WL1 are changed to a selectable state. The transistor T41 is also turned on to be in the conductive state, so that the plate line is driven. That is, the plate line potential $V_{PL}$ is supplied to the plate line PL1 through the transistor T41. As a result, data stored in the memory cells MC are read out onto the first bit lines BL11 to BL1n, respectively. In this case, since the word line WL2 is in the non-selection level so that the memory cells MC connected to the word line WL2 are also in the non-selection state, the potential levels of the bit lines BL21 to BL2n do not almost change. A potential difference between the bit lines BL11 and BL21 of a pair, to BL1n and BL2n of each of bit line pairs is amplified by a sensing amplifier (not shown). The same is true for the other bit line pairs. As a result, the data stored in the memory cells in the selectable state can be read out. (See "FA 16.2: A 256 kb Nonvolatile Ferroelectric Memory at 3 V and 100 ns" by Sumi et al., (IEEE International solid-State Circuits Conference, DIGEST OF TECHNICAL PAPERS, pp. 268–269, 1994)) In this reference, the memory capacity has the capacity of 256 Kb and an access cycle time of 200 ns can be accomplished under the condition of power supply voltage of 3.0 V and consumption current of 3 mA.

In the non-volatile ferroelectric memory device, data can be stored in the memory cell MC by applying an electric field to the ferroelectric film to induce polarization, and the data can be read out by sensing the induced polarization. For this reason, it is necessary to supply a predetermined voltage to a plate line as described above. In addition, the capacitance of the capacitive element C is greater than that of a capacitor in a normal DRAM. Therefore, in the non-volatile ferroelectric memory device, it takes a long time to drive the plate line and it is difficult to operate the memory device at a high speed. For instance, in a case of normal DRAM having the memory capacity of 64 Mb, an access cycle time of 90 ns can be accomplished. In addition, since the plate line is charged and discharged, the power consumption increases.

Next, the circuit diagram of an example of conventional non-volatile ferroelectric memory device is shown in FIG. 5 in which the potential of plate line is fixed. Such an example is disclosed in a Japanese Laid Open Patent Disclosure (JP-A-Hei2-110895).

This non-volatile ferroelectric memory device includes a memory cell array 1y having the same arrangement as in the above-described first conventional memory device except that a plurality of plate lines (PL1, . . . ) are integrated into a common plate line PL. Note that only the two memory cells and pair of bit lines BL11 and BL21 are shown in the figure. Also, the non-volatile ferroelectric memory device includes a plurality of sense amplifiers SA (SA1, . . . ) for each amplifying a potential difference between bit lines of each of pairs such as BL1 and BL2 at a predetermined timing in accordance with control signals SEP and SEN, a precharge circuit 106 for precharging bit lines (BL1, BL2, . . . ) to an intermediate potential level in response to a bit line precharge signal BLP, and an intermediate potential generating circuit 105 for generating an intermediate potential between a logic "1" level and a logic "0" level and supplying the generating potential to the precharge circuit 106 and the plate line PL. The memory device further includes a reference level generating circuit 107 which sets the potentials of bit lines (BL11, BL21, . . . ) to a ground potential level in response to a bit line potential setting signal BLST immediately before one of the word lines, e.g., WL1 changes to a selection level, and supplies a reference level to the bit lines. One corresponding to a selected word line of dummy word lines DWL (DWL1, DWL2, . . . ) to which dummy memory cells are respectively connected is set in the selection level in synchronous with the transit of the selected word line to the selection level and data stored in the memory cell MC is read out on the bit line.

Next, the read operation of the above non-volatile ferroelectric memory device will be described below with reference to FIGS. 6A through 6H.

In a standby state before the memory cell MC is accessed, pairs of bit lines (BL11 and BL21, . . . ) are precharged to an intermediate potential which is substantially the same as that of the plate line PL, as shown in FIG. 6H. For simplification of description, only the pair of bit lines BL11 and BL21 will be described below.

Immediately before the word line WL1 is set in the selection level after access starts, the bit line potential setting signal BLST becomes active as shown in FIG. 6C so that the bit lines BL11 and BL21 are set to the ground potential level as shown in FIG. 6H. Alternatively, the potential may be a power source potential level. Then, the word line WL1 and the dummy word line DWL1 are changed to the selection level as shown in FIGS. 6B and 6C so that the stored information in the selected memory cell MC is read out to the bit line BL21 as shown in FIG. 6H. At this time, the reference level is supplied from the reference level generating circuit 107 to the bit line BL21. Thereafter, like the conventional DRAM, the potential difference between the bit lines BL11 and BL21 is sensed and amplified by the sense amplifier SA1 to be output externally, as shown in FIG. 6H.

In this standby state, if the transistor T of the memory cell MC is in the off state so that a cell node Nmc between the capacitive element C and the transistor T is in a floating state, there is a leakage current between the cell node Nmc and the substrate or well in which the transistor T is formed, although the level of leakage current is very low. The leakage between the cell node and the substrate/well of the ground potential level or power source level makes the potential of cell node Nmc set in the ground potential level or the power source level finally, resulting in inversion of spontaneous polarization of the memory cell MC. For this reason, in this example, the transistor T is slightly turned on by setting the potential level of the word lines WL1, . . . to an intermediate level between the selection level and the non-selection level, so that the charge leaked from the cell node Nmc to the substrate/well is compensated from the bit line. As a result, the potential of cell node Nmc is kept in substantially the same intermediate potential as that of the plate line such that the inversion of spontaneous polarization can be prevented. In this example, the reference level of the bit line is set by the reference level generating circuit 107. However, the way in the first example may be applied.

As described above, in the conventional non-volatile ferroelectric memory device, the plate line is driven to a predetermined level for every access, as shown in the first example. Therefore, a long time is required to drive the plate line. As a result, it is difficult to operate the memory device at a high speed. In addition, the power consumption is increased for charging and discharging of the plate line. In the second example, since a predetermined potential is always supplied to the plate line, there is no problem as in the first example. However, in order to prevent the inverse of spontaneous polarization because of the leakage of charge from the cell node to the substrate/well, it is necessary that a transistor is slightly turned on by setting the word line in a predetermined level between the selection level and the non-selection level, so that the leakage of charge from the cell node is compensated from the bit line to keep the potential of cell node in the substantially the same potential as that of the plate line. In this case, the control of word line potential is complicated and there is a case that a transistor of the memory cell is not turned on because of the dispersion of manufactured devices in characteristic. As a result, the leak cannot be compensated so that the spontaneous polarization may be inverted.

SUMMARY OF THE INVENTION

The present invention has, as an object, to provide a non-volatile ferroelectric memory device in which the control of word line potential can be simplified while the high speed operation and low power consumption is kept.

Another object of the present invention is to provide a non-volatile ferroelectric memory device that can reliably prevent the erroneous inversion of spontaneous polarization in a standby state.

Still another object of the present invention is to provide a method of operating such a non-volatile ferroelectric memory device as described above.

In order to achieve an aspect of the present invention, a non-volatile ferroelectric memory device includes a plurality of memory cells provided in a matrix manner, each of which comprises a transistor having a gate and source and drain regions formed in a semiconductor region, and a ferroelectric capacitor having first and second electrodes and a ferroelectric layer interposed between the first and second electrodes. The second electrode is connected to one of the source and drain regions of the transistor. The memory device further includes a plurality of pairs of bit lines, each of the bit lines of each of the pairs being connected to the other of the source and drain regions of the transistor of each memory cell in a column of the plurality of memory cells, a plurality of word lines each of which is connected to the gate of the transistor of each memory cell in a row of the plurality of memory cells, a plate potential section for generating a first predetermined potential intermediate between a reference potential and a high DC voltage and supplying the first potential to the first electrode of each of the plurality of memory cells, a well potential section for generating a second predetermined potential lower than the first potential with respect to the reference potential and supplying the second potential to the semiconductor region of each of the plurality of transistors, and a sense amplifier section for sensing a data using potentials on the bit lines of each of the plurality of pairs of bit lines. The well potential section functions as a preventing section for preventing a leakage current from flowing from the ferroelectric layer.

The second potential is preferable to be in a range of (the high voltage—a threshold voltage of the transistor)/2 to (the high voltage)/2. The second potential is preferably such that a potential difference between the first potential and the second potential is smaller than a coercive voltage of the ferroelectric layer. Further preferably, the second potential is such that the second potential is smaller than a potential corresponding to a turn-on voltage of a diode formed by the semiconductor region and one of the source and drain regions. Thereby, charge leakage from the ferroelectric layer though the diode can be prevented. Furthermore, if a potential of each of the plurality of word lines is equal to or lower than the second potential when the each word line is not selected, the charge leakage through the transistor when the corresponding word line is not selected can be also prevented.

In the present invention, it is preferable that the first and second potentials have predetermined fixed values and are generated from a single DC voltage, respectively, because a plate line supplied with the second potential needs not to be driven for a data read operation.

In order to achieve another aspect of the present invention, in a non-volatile ferroelectric memory device comprising a plurality of memory cells provided in a matrix manner, each of which comprises a transistor having a gate and source and drain regions formed in a semiconductor region, and a ferroelectric capacitor having first and second electrodes and a ferroelectric layer interposed between the first and second electrodes, the second electrode being connected to one of the source and drain regions of the transistor, a method of operating the memory device with less leakage current from a memory cell, comprising the steps of:

generating a first predetermined fixed potential intermediate between a reference potential and a high DC voltage to supply the first potential to the second electrode of the memory cell;

generating a second predetermined fixed potential lower than the first potential with respect to the reference potential to supply the second potential to the semiconductor region of the transistors; and sensing a data of the memory cell using potentials on a bit line connected to the memory cell when the memory cell is selected.

BRIEF DESCRIPTION OF THE DRAWINGS

FIG. 13(A through H) are timing charts for explaining the operation of the non-volatile ferroelectric memory device shown in FIG. 7.

DESCRIPTION OF THE PREFERRED EMBODIMENT

The present invention will be described below in detail with reference to the accompanying drawings.

Figure 1A:
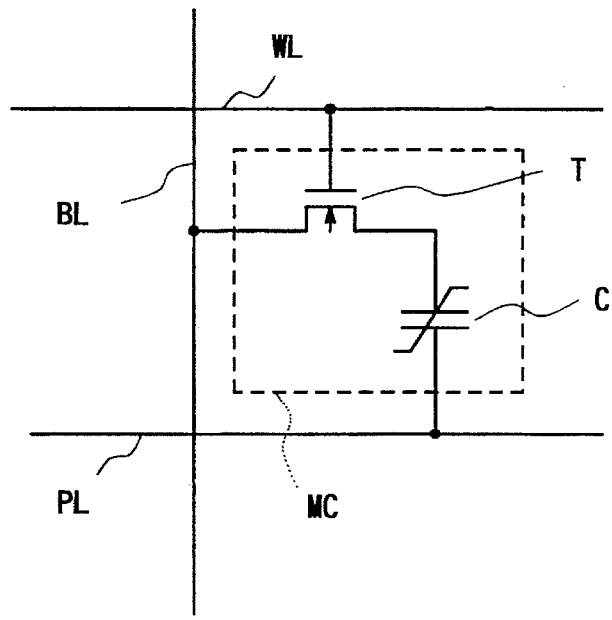
FIG. 1A is a diagram showing the arrangement of a typical memory cell using a ferroelectric film.
Figure 1B:
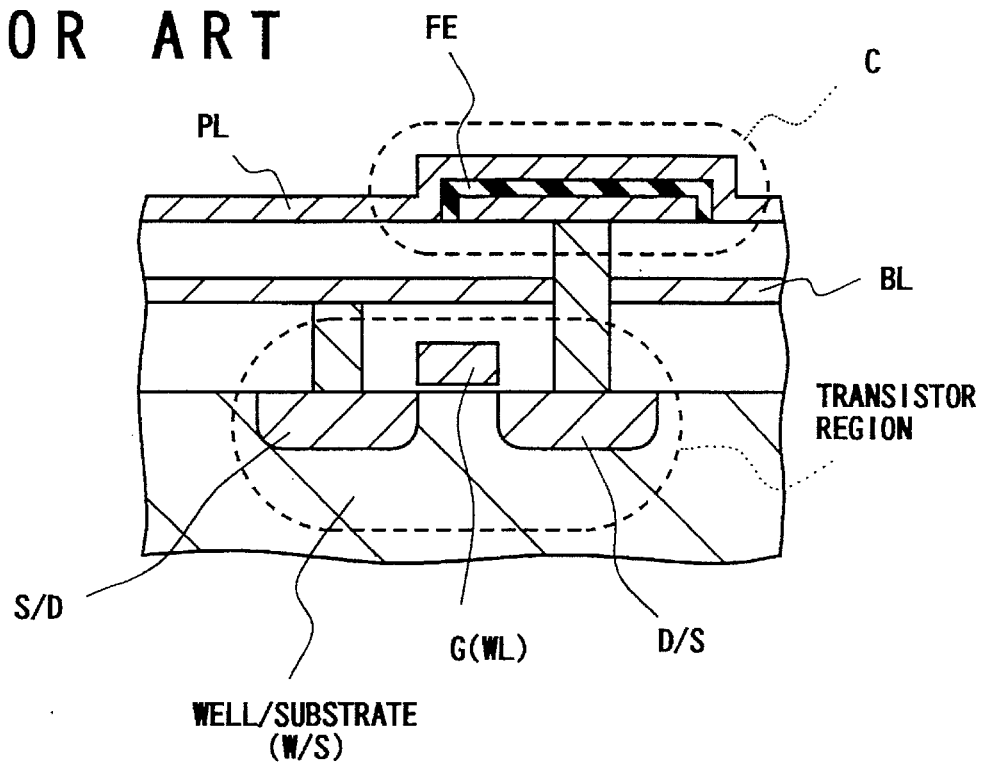
FIG. 1B is a schematic cross sectional view of the memory cell shown in FIG. 1A.
Figure 2A:
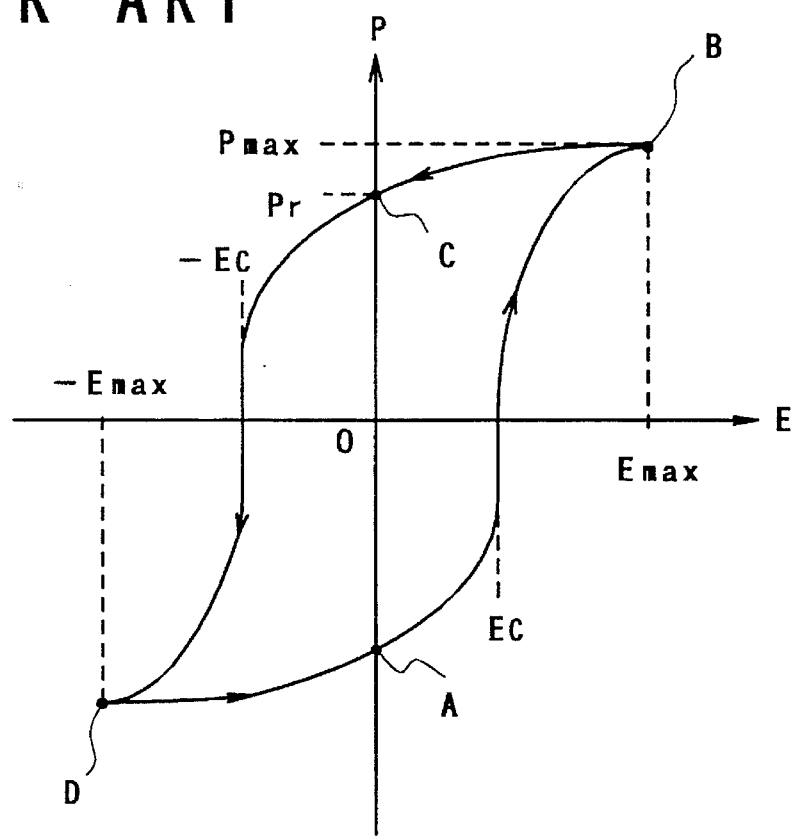
FIG. 2A is a diagram showing the polarization characteristic of the ferroelectric film used in the memory cell.
Figure 2B:
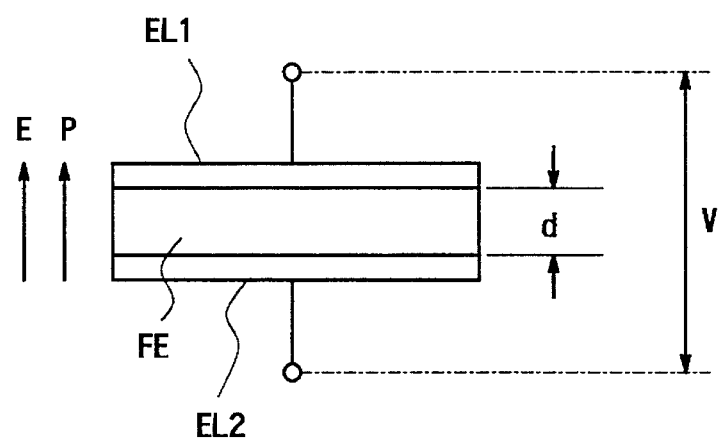
FIG. 2B is a diagram of the structure of a capacitor used in the memory cell.
Figure 3:
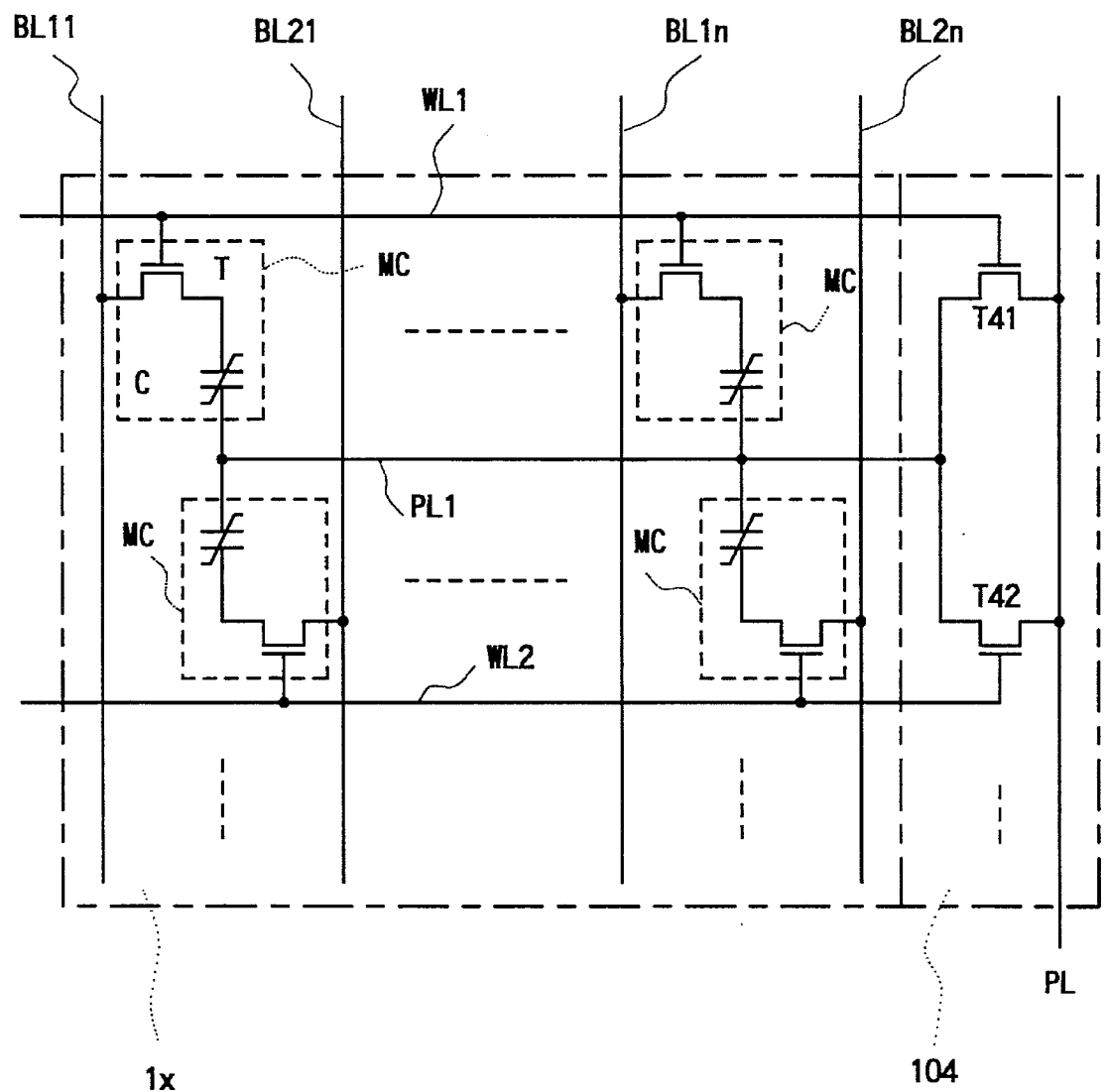
FIG. 3 is a block diagram of a first example of conventional non-volatile ferroelectric memory device.
Figure 4:
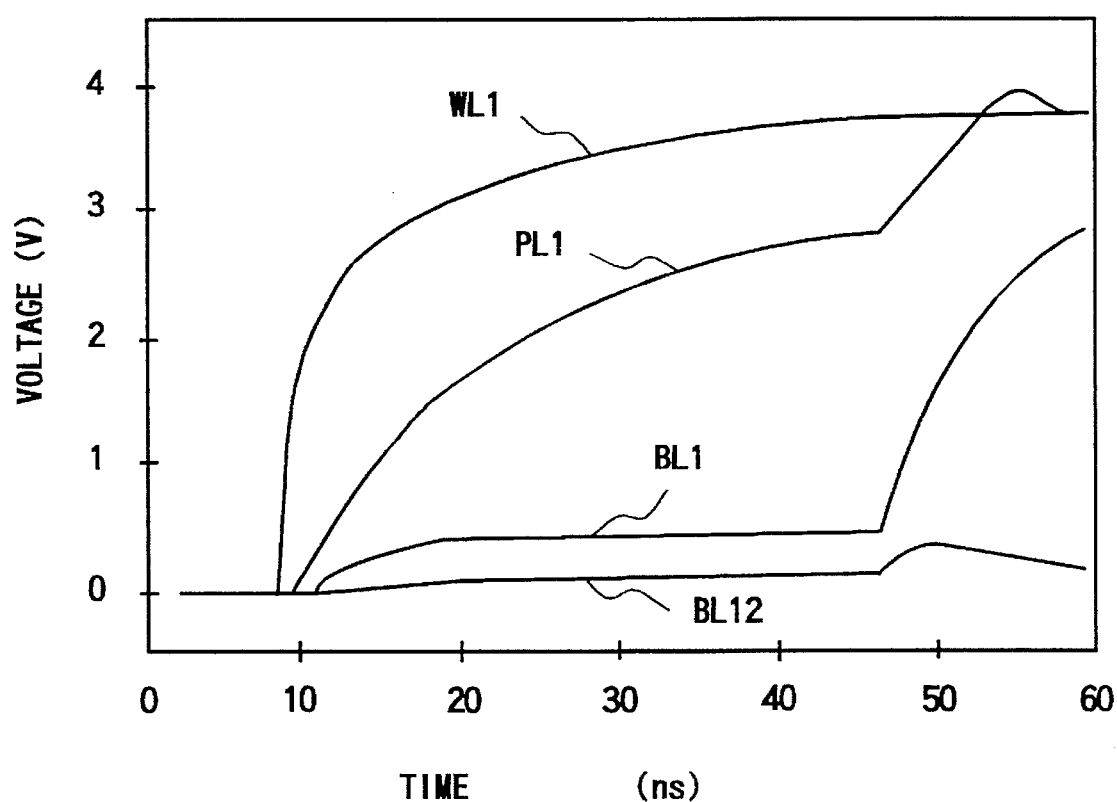
FIG. 4 is a diagram showing a relation of the voltages of various signals and time.
Figure 5:
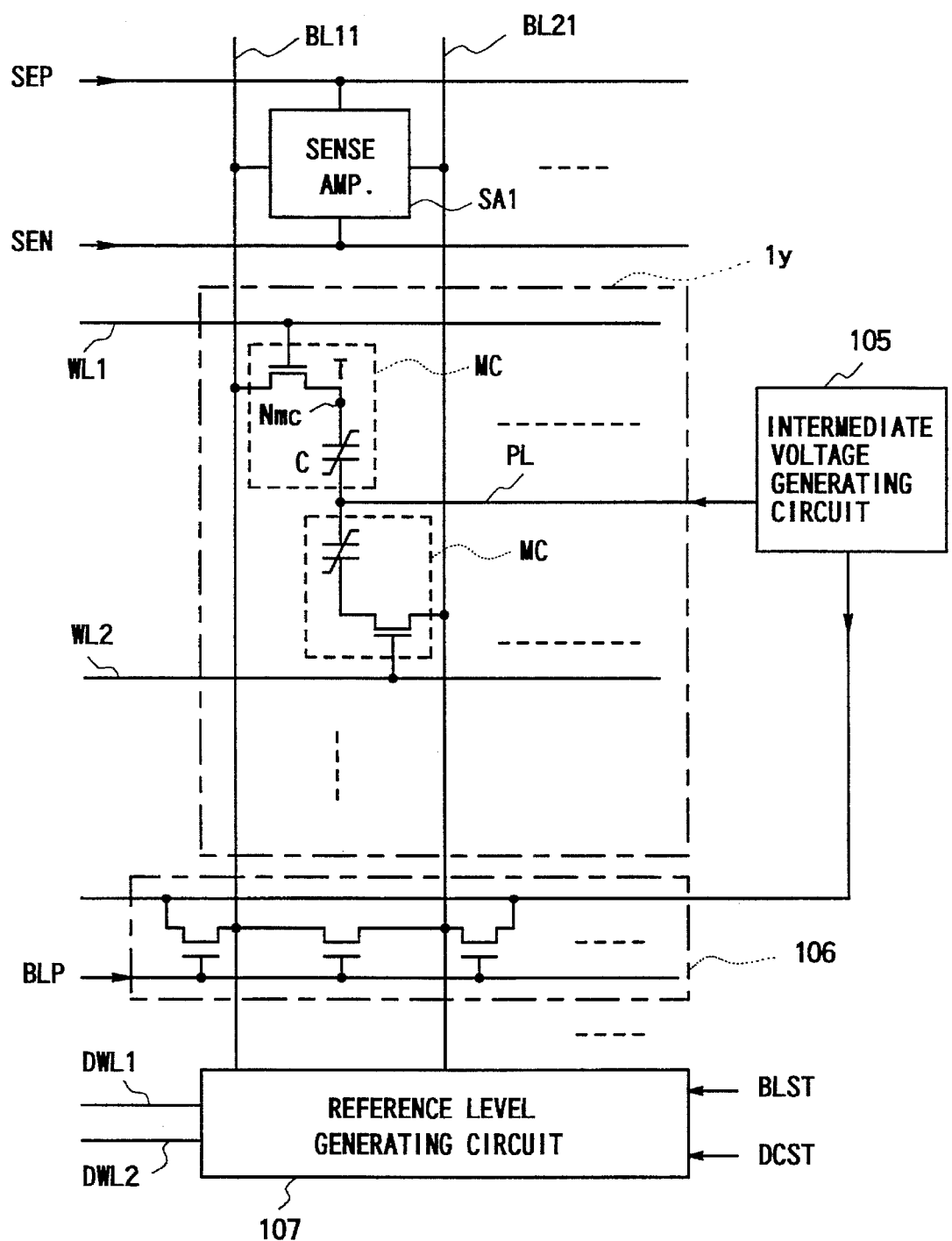
FIG. 5 is a block diagram of a second example of conventional non-volatile ferroelectric memory device.
Figure 6:
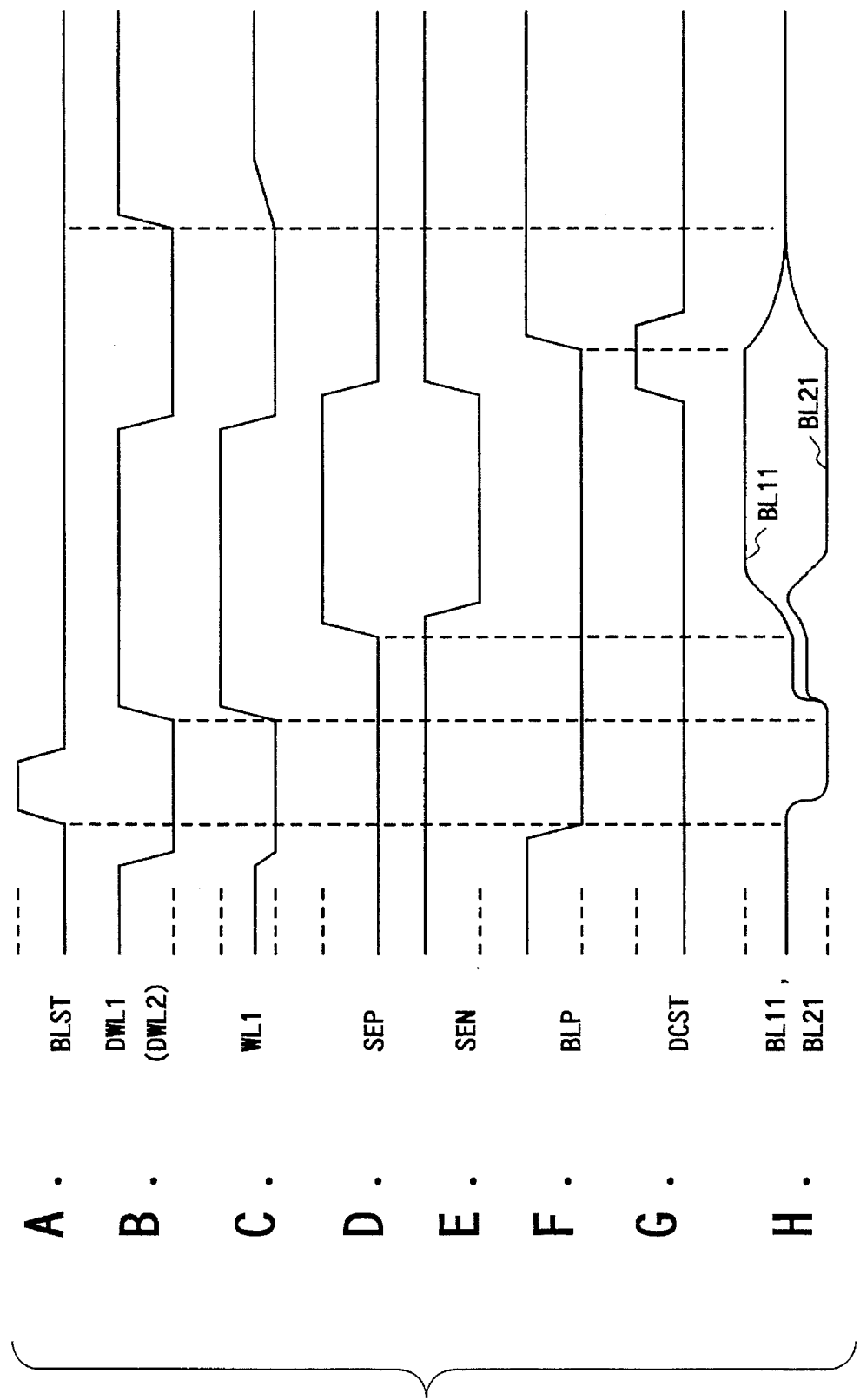
FIG. 6(A through H) are timing charts for explaining the operation of the second example shown in FIG. 5.
Figure 7:
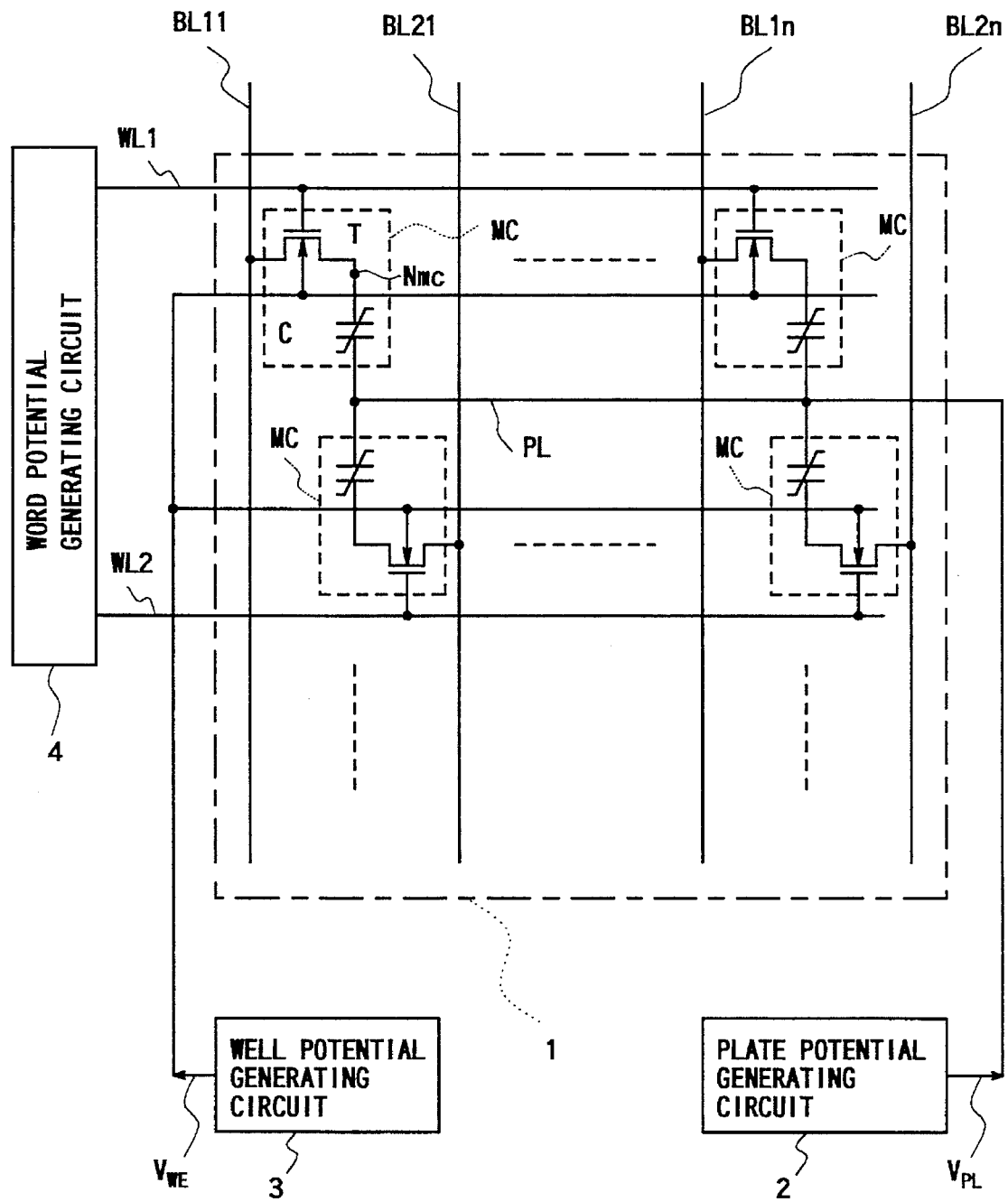
FIG. 7 is a block diagram of the structure of a non-volatile ferroelectric memory device according to an embodiment of the present invention.

FIG. 7 is a block diagram showing the non-volatile ferroelectric memory device according to an embodiment of the present invention. Referring to FIG. 7, the non-volatile ferroelectric memory device includes a memory cell array 1, a plate potential generating circuit 2, a well potential generating circuit 3, and a word line potential generating circuit 4. The memory cell array 1 includes a plurality of memory cells MC in a matrix manner in row and column directions. Each of the plurality of memory cells MC is composed of an n-channel transistor T and a capacitive element C. The transistor T has source and drain regions (S/D) and a gate as the word line. The capacitive element C is composed of two electrodes EL1 and EL2 and a ferroelectric film FE for storing a binary data depending upon the polarization state as shown in FIG. 2B. One of the two electrodes EL1 is connected to one of the source and drain regions (S/D) of the transistor. The memory cell array 1 also includes a plurality of word lines (WL1, WL2, . . . ) provided in correspondence to the rows of the plurality of memory cells MC. Each of the word lines is connected to the gates of transistors of one column and sets the column of memory cells in a selection state when the potential of word line is at a high level. The memory cell array 1 further includes a plurality of bit lines (BL11, BL21, ..., BL1n, BL2n) provided in correspondence to the columns of the memory cells MC. Each of the bit lines is connected to the other of the source and drain regions S/D of each transistor T of the column of memory cells (the one of the source and drain regions is connected to the electrode EL1 of the capacitive element to form a cell node Nmc, as described above). One odd-numbered bit line and an adjacent even-numbered bit line are paired. In addition, the memory cell array 1 also includes plate lines each connected to the other electrode EL2 of the capacitive element C of each of the plurality of memory cells.

The plate potential generating circuit 2 always supplies an intermediate fixed potential between the logic low level and logic high level of the binary data on the plate line PL as a plate potential $V_{PL}$. The well potential generating circuit 3 generates a predetermined fixed potential as a well potential. The well potential is a potential such that the potential difference between the well potential and the plate potential is smaller than the coercive voltage of the ferroelectric film of the memory cell and such that a potential difference between the well potential and a lower potential of a single power source is smaller than a turn-on voltage Von of the diode formed by one of the source and drain regions connected to the capacitive element and the well/substrate in which the transistor is formed. The word line potential generating cirucit 4 generates a word line potential to supply to the word lines. The word line potential is equal to the lower potential of the single power source in the standby state and to a higher potential of the single power source in the selection state.

Figure 11:
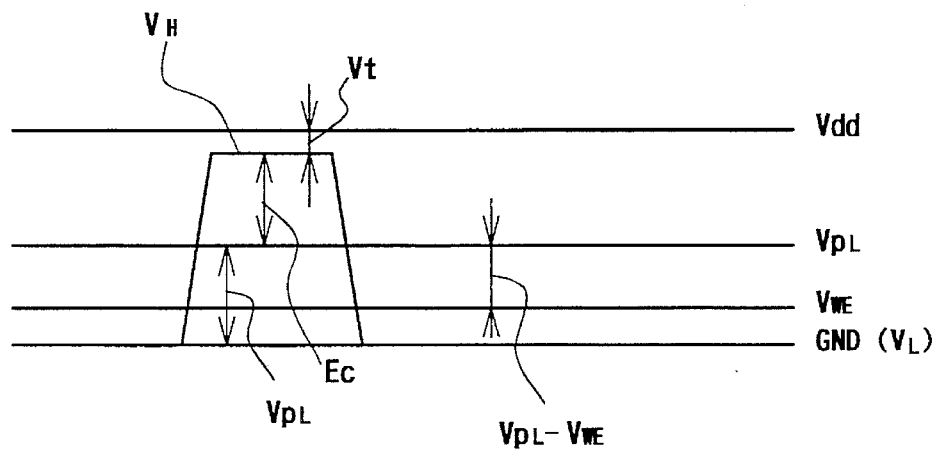
FIG. 11 is a diagram showing the potentials of nodes when the memory cells are accessed.

Next, the read and write operation in the non-volatile ferroelectric memory device according to the present invention will be described. FIG. 11 is a diagram showing the potential change of a memory cell nodes Nmc when a memory cell MC is accessed of the memory cells. Assuming that the transistor T of the memory cell MC is of an n-channel type and has a threshold voltage $V_T$. Also, assuming that the single power source has a potential Vdd as the higher potential and a potential GND as the lower potential, so that the word line is switched between the potential Vdd and the potential GND. When the bit line potential $V_{BL}$ is Vdd, if the word line potential $V_{WL}$ is driven to the Vdd as the selection level potential, the potential $V_N$ of cell node Nmc potential is Vdd–$V_T$ (=$V_H$). On the contrary, when the bit line potential $V_{BL}$ is GND ($V_L$), if the word line potential $V_{WL}$ is Vdd, the memory cell node potential $V_N$ is GND. Accordingly, the memory cell node potential swings between the potential (Vdd–$V_T$) and GND. The coercive voltage Vc of the ferroelectric film FE is determined based on the coercive electric field Ec determined depending upon the ferroelectic material and the film thickness of the ferroelectric film FE. If the potentials Vdd, the threshold voltage $V_T$ and the film thickness d are selected in such a manner that ($V_H$–$V_{PL}$)>Vc and ($V_N$–$V_{PL}$)<–Vc are satisfied, the read and write operations can be executed as in the above conventional memory devices.

Figure 8:
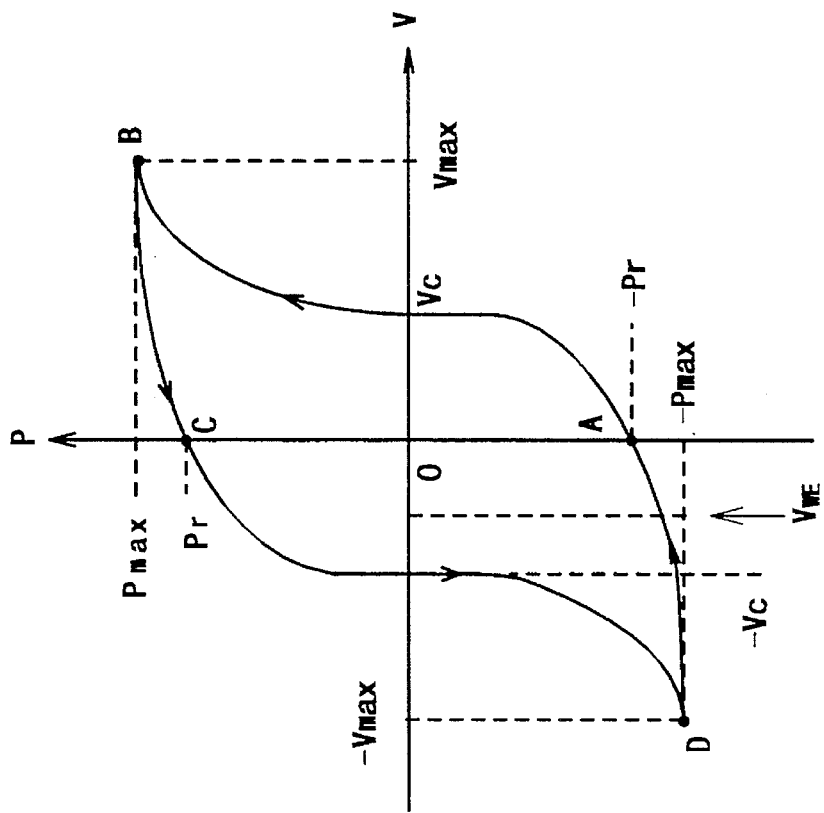
FIGS. 8 through 10 are diagrams showing polarization characteristic curves of a ferroelectric film used in the memory cell of the non-volatile ferroelectric memory device of the present invention to explain the operation principle.
Figure 9:
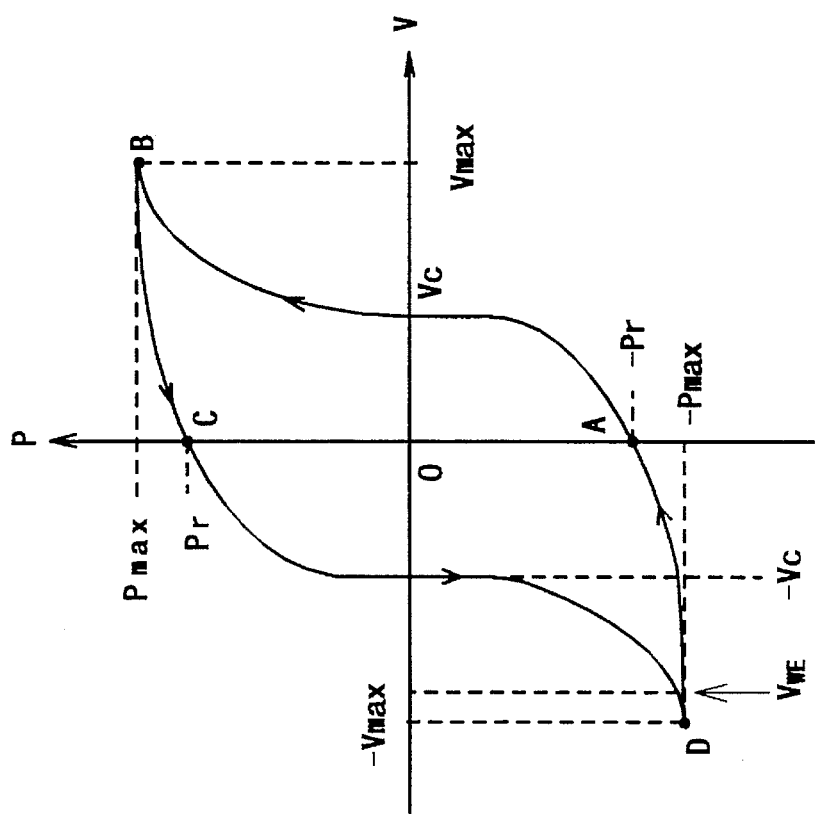
Figure 12A:
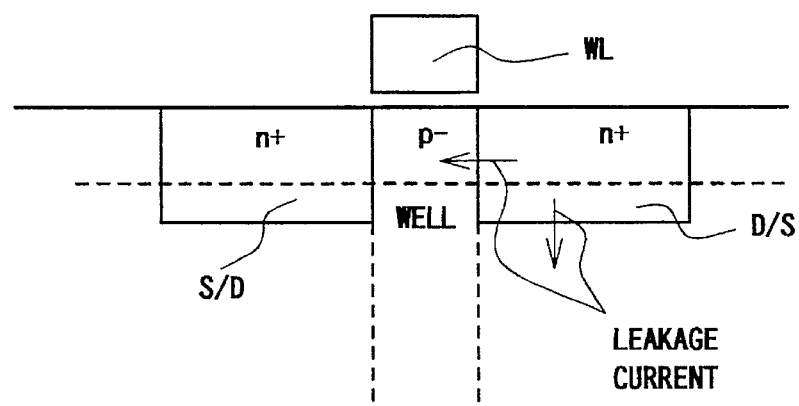
FIG. 12A is a partial cross sectional view of a transistor used in the memory cell and FIG. 12B is a diagram showing a potential distribution corresponding to the partial cross sectional view.
Figure 12B:
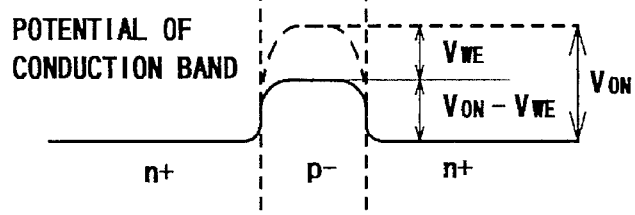

However, as shown in FIGS. 12A and 12B, there is a small leakage current between one the source and drain regions of the transistor T connected to the memory cell node Nmc and the well or substrate in which the transistor T is formed. As a result, after sufficiently long time period, the potentials $V_H$ and $V_L$ would go to a potential $V_{WE}$ of the well or substrate (to be referred to as "well potential $V_{WE}$"

hereinafter). In a case that there is a relation of FIG. 8 between the potentials $V_{WE}$, —Vc, $V_{PL}$, Vc and Vmax, when the potential $V_N$ changes to the potential $V_{WE}$ in the memory cell MC which is not accessed during a sufficiently long time period, a binary data to be held in the state C would be rewritten as a binary data held in the state A. Therefore, the well potential $V_{WE}$ needs to be set to satisfy |$V_{PL}$–$V_{WE}$|<Vc. This relation is shown in FIG. 9.

Figure 10:
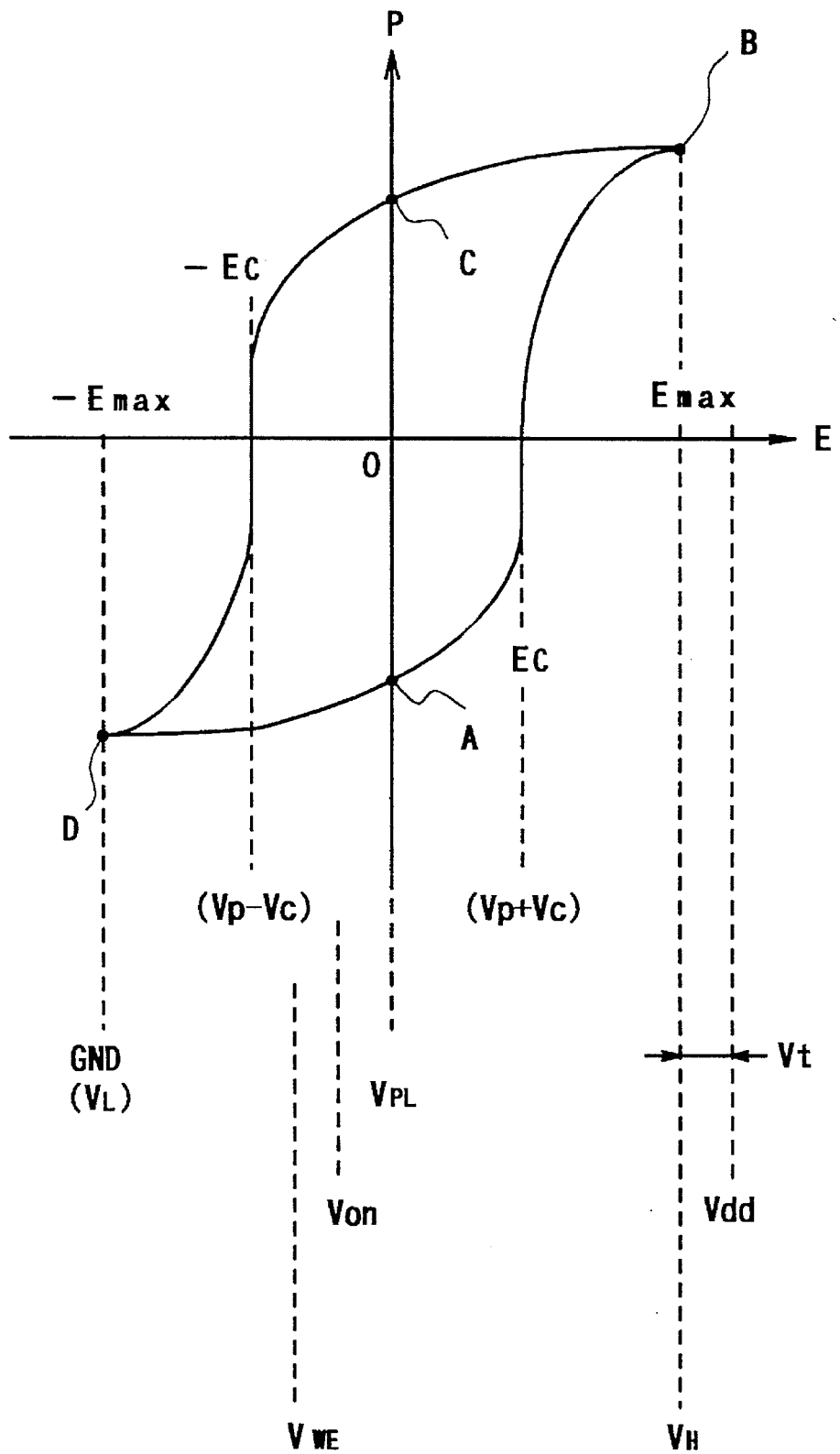

However, if the well potential $V_{WE}$ is too high, there would be a case that a current flows through a diode formed by the well or substrate and the one region of the source and drain regions (S/D) of the transistor T connected to the memory cell node Nmc, so that the memory cell node potential $V_N$ and bit line potential $V_{BL}$ do not rise sufficiently. In order to prevent this phenomenon, it is necessary that the well potential $V_{WE}$ is lower than the potential Von corresponding to the turn-on voltage of the diode, or the bit line potential $V_{BL}$ is equal to the plate potential $V_{PL}$ in the standby state as shown in FIG. 10.

Otherwise, there is a case that the charge stored in the capacitive element C is lost in addition to the above mechanism. When the transistor is activated, the binary data stored in the memory cell is destroyed by a current flowing from the memory cell node Nmc through the transistor T. In the non-volatile ferroelectric memory device according to the present invention, since the gate potential or word line potential is at the potential GND when the memory cell is not selected and the well potential $V_{WE}$ is higher than the potential GND, electrons are rejected from the channel region immediately under the gate so that no current flows between the source and drain regions.

More specifically, since the electric fields Emax and —Emax correspond to the potentials Vdd and GND and the potentials $V_H$ and $V_L$ correspond to the potentials (Vdd–$V_T$) and GND, the plate line potential $V_{PL}$ is selected such that the following relation is satisfied.

$$V_{PL}=(V_H-V_L)/2=V_H/2=(Vdd-V_T)/2 \quad (1)$$

also, the well potential $V_{WE}$ is selected such that the following relation is satisfied.

$$(V_{PL}-Vc)<V_{WE}<Von \quad (2)$$

When the plate line potential $V_{PL}$ and the well potential $V_{WE}$ are kept to satisfy the above two equations (1) and (2), the electric field greater than the coercive electric field (—Ec) is not generated in the standby state, even if there is a leak current between the memory cell node Nmc and the well or substrate in which transistor T of the memory cell MC is formed. As a result, the spontaneous polarization of the ferroelectric film is not inverted. When the well potential is too high, a forward current flows through a diode formed by the source and drain regions and the well or substrate. In the embodiment, however, since $V_{WE}$<Von, the memory cell node potential Nmc and the bit line potential can be increased to predetermined levels.

When the potential Vdd is 5.0 V, the threshold voltage $V_T$ of the transistor T is 1.0 V, and the turn-on voltage of the diode in the well or substrate region is 0.8 V, if the coercive voltage Vc is about 1.5 V, if a PZT film (PbZrTiO:lead zirconium titanium oxide) having the film thickness of 300 nm is employed as the ferroelectric film, the plate line potential $V_{PL}$ is 2.0 V and the well potential is 0.7 V. Although a potential difference between the potentials Von and $V_{WE}$ is 0.1 V only, the turn-on potential can be controlled precisely in unit of 10 mV, like the turn-on voltage of a bipolar transistor. Also, since the potential $V_{WE}$ is the fixed potential on the operation of the memory device, the well potential generating circuit 3 can be provided outside of the memory cell array 1.

In the above embodiment, as shown in FIGS. 13A to 13H, the bit lines BL are precharged to the potential GND or Vdd immediately before a word line is set in the selection level after the access is started, like the above second conventional example. Then, when the word line is set in the selection level, data stored in the memory cells can be read out on bit line pairs such as BL11 and BL21. In the embodiment, in the standby state in which the read and write operations are not executed, the word line potentials are always fixed to the potential GND as the non-selection level. Therefore, it is not necessary to complicatedly control the word line potentials, so that any transistor T is not turned on because of the dispersion in the manufacture, resulting in reliable prevention of inversion of spontaneous polarization of the ferroelectric element. Further, since the plate line potential is fixed even during the read or write operation, the high speed operation and low power consumption can be accomplished in the non-volatile ferroelectric memory device according to the present invention.

What is claimed is:

1. A non-volatile ferroelectric memory device comprising:

a plurality of memory cells provided in a matrix manner, each of which comprises a transistor having a gate and source and drain regions formed in a semiconductor region, and a ferroelectric capacitor having first and second electrodes and a ferroelectric layer interposed between said first and second electrodes, said second electrode being connected to one of said source and drain regions of said transistor;

a plurality of pairs of bit lines, each of said bit lines of each of said pairs being connected to the other of said source and drain regions of said transistor of each memory cell in a column of said plurality of memory cells;

a plurality of word lines each of which is connected to said gate of said transistor of each memory cell in a row of said plurality of memory cells;

plate potential means for generating a first predetermined potential intermediate between a reference potential and a high DC voltage and supplying said first potential to said first electrode of each of said plurality of capacitors;

well potential means for generating a second predetermined potential lower than said first potential with respect to the reference potential and supplying said second potential to the semiconductor region of each of said plurality of transistors; and sense amplifier means for sensing a data using potentials on the bit lines of each of said plurality of pairs of bit lines.

2. The non-volatile ferroelectric memory device according to claim 1, wherein said plate potential means generates said first potential in a range of (the high DC voltage—a threshold voltage of the transistor)/2 to (the high voltage)/2.

3. The non-volatile ferroelectric memory device according to claim 1, wherein said well potential means generates said second potential such that a potential difference between said first potential and said second potential is smaller than a coercive voltage of said ferroelectric layer.

4. The non-volatile ferroelectric memory device according to claim 1, wherein said well potential means generates said second potential such that said second potential is smaller than a potential corresponding to a turn-on voltage of a diode formed by said semiconductor region and one of said source and drain regions.

5. The non-volatile ferroelectric memory device according to claim 3, wherein said well potential means generates said second potential such that said second potential is smaller than a potential corresponding to a turn-on voltage of a diode formed by said semiconductor region and one of said source and drain regions.

6. The non-volatile ferroelectric memory device according to claim 1, wherein said first and second potentials have predetermined fixed values, respectively.

7. The non-volatile ferroelectric memory device according to claim 1, wherein a potential of each of said plurality of word lines is equal to or lower than said second potential when said each word line is not selected.

8. The non-volatile ferroelectric memory device according to claim 1, said plate potential means and said well potential means generates said first and second potentials from a single DC voltage supplied to the memory device.

9. The non-volatile ferroelectric memory device according to claim 1, wherein said first and second potentials are both equal to each other when said DC voltage is not applied and said first and second potentials have a relative relationship such that a potential difference between the first and second potentials is smaller than a coercive voltage when said DC voltage is applied.

10. In a non-volatile ferroelectric memory device comprising a plurality of memory cells provided in a matrix manner, each of which comprises a transistor having a gate and source and drain regions formed in a semiconductor region, and a ferroelectric capacitor having first and second electrodes and a ferroelectric layer interposed between said first and second electrodes, said second electrode being connected to one of said source and drain regions of said transistor, a method of operating the memory device with less leakage current from a memory cell, comprising the steps of:

generating a first predetermined fixed potential intermediate between a reference potential and a high DC voltage to supply said first potential to the second electrode of the memory cell;

generating a second predetermined fixed potential lower than said first potential with respect to the reference potential to supply said second potential to the semiconductor region of the transistors; and sensing a data of the memory cell using potentials on a bit line connected to the memory cell when the memory cell is selected.

11. The method according to claim 10, wherein said step of generating a second potential includes generating said second potential such that a potential difference between said first potential and said second potential is smaller than a coercive voltage of said ferroelectric layer.

12. The method according to claim 10, wherein said step of generating a second potential includes generating said second potential such that said second potential is smaller than a potential corresponding to a turn-on voltage of a diode formed by said semiconductor region and one of said source and drain regions.

13. The method according to claim 10, wherein a potential of a word line connected to the gate of the transistor is equal to or lower than said second potential when said memory cell is not selected.

14. The method according to claim 10, said first and second potentials are generated from a single DC voltage supplied to the memory device.

15. The method according to claim 14, wherein said first and second potentials are both equal to each other when said DC voltage is not applied and said first and second potentials have a relative relationship such that a potential difference between the first and second potentials is smaller than a coercive voltage when said DC voltage is applied.

16. A non-volatile ferroelectric memory device comprising:

a plurality of memory cells provided in a matrix manner, each of which comprises a transistor having a gate and source and drain regions formed in a semiconductor region, and a ferroelectric capacitor having first and second electrodes and a ferroelectric layer interposed between said first and second electrodes, said second electrode being connected to one of said source and drain regions of said transistor;

a plurality of pairs of bit lines, each of said bit lines of each of said pairs being connected to the other of said source and drain regions of said transistor of each memory cell in a column of said plurality of memory cells;

a plurality of word lines each of which is connected to said gate of said transistor of each memory cell in a row of said plurality of memory cells;

plate potential means for generating a predetermined plate potential intermediate between a reference potential and a high DC voltage and supplying said plate potential to said first electrode of each of said plurality of memory cells;

sense amplifier means for sensing a data using potentials on the bit lines of each of said plurality of pairs of bit lines; and preventing means for preventing a leakage current from flowing from said ferroelectric layer.

17. The non-volatile ferroelectric memory device according to claim 16, wherein said preventing means generates a semiconductor region potential such that said semiconductor region potential is smaller than a potential corresponding to a turn-on voltage of a diode formed by said semiconductor region and said one of said source and drain regions and supplies the generated potential to said semiconductor region.

18. The non-volatile ferroelectric memory device according to claim 16, wherein said preventing means generates a semiconductor region potential such that said semiconductor region potential is higher than a potential of each of said plurality of word lines when said each word line is not selected.

19. The non-volatile ferroelectric memory device according to claim 16, wherein said preventing means includes well potential means for generating a predetermined semiconductor region potential lower than said plate potential with respect to the reference potential and supplying said semiconductor region potential to the semiconductor region of each of said plurality of transistors.

20. The non-volatile ferroelectric memory device according to claim 19, wherein said well potential means generates said second potential such that a potential difference between said plate potential and said semiconductor region potential is smaller than a coercive voltage of said ferroelectric layer.

21. A semiconductor memory device comprising:

a plurality of memory cells each having a transistor and storage capacitor coupled together;

a plate potential circuit for generating a first predetermined potential to an electrode of a plurality of said storage capacitors; and a well potential circuit for generating a second predetermined potential lower than said first predetermined potential to a well region of said transistors.

22. The semiconductor memory device according to claim 21, wherein said first predetermined potential is intermediate between a reference potential and a high DC voltage and said second predetermined potential is lower than said first predetermined potential with respect to said reference potential.

23. The semiconductor memory device according to claim 22, wherein said plate potential circuit generates said second predetermined potential in a range of (the high DC voltage—a threshold voltage of the transistor)/2 to (the high DC voltage)/2.

24. The semiconductor memory device according to claim 21, wherein said well potential circuit generates said second predetermined potential such that a potential difference between said first predetermined potential and said second predetermined potential is smaller than a coercive voltage of a dielectric layer of said storage capacitors.

25. The semiconductor memory device according to claim 21, wherein said well potential circuit generates said second predetermined potential such that said second predetermined potential is smaller than a potential corresponding to a turn-on voltage of a diode formed by a semiconductor region of said transistors and one of a source and a drain regions of said transistors.

26. In a semiconductor memory device comprising a plurality of memory cells each having a transistor coupled to a storage capacitor which has electrodes and a dielectric layer interposed between said electrodes, a method of operating the memory device with less leakage current from a memory cell, comprising the steps of:

generating a first predetermined potential intermediate between a reference potential and a high DC voltage to supply said first predetermined potential to one of said electrodes of the storage capacitors; and generating a second predetermined potential lower than said first predetermined potential with respect to the reference potential to supply said second predetermined potential to a semiconductor region of said transistors.

27. The method according to claim 26, wherein said step of generating a second predetermined potential includes generating said second predetermined potential such that a potential difference between said first predetermined potential and said second predetermined potential is smaller than a coercive voltage of said dielectric layer.

28. The method according to claim 26, wherein said step of generating a second predetermined potential includes generating said second predetermined potential such that said second predetermined potential is smaller than a potential corresponding to a turn-on voltage of a diode formed by said semiconductor region and one of a source and a drain region of said transistors.

* * * * *